United States Patent
Epperson et al.

(10) Patent No.: US 7,193,459 B1
(45) Date of Patent: Mar. 20, 2007

(54) POWER AMPLIFIER CONTROL TECHNIQUE FOR ENHANCED EFFICIENCY

(75) Inventors: Darrell G. Epperson, Oak Ridge, NC (US); Carlos Gamero, High Point, NC (US); Ryan Bosley, Greensboro, NC (US); Joel R. Gibson, Chandler, AZ (US); Michael LaBelle, Phoenix, AZ (US); Scott Yoder, Holly Springs, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 154 days.

(21) Appl. No.: 10/874,590

(22) Filed: Jun. 23, 2004

(51) Int. Cl.
*H03G 3/10* (2006.01)
(52) U.S. Cl. ............... 330/130; 330/133; 330/134; 330/296; 330/297; 330/310; 330/267; 330/223; 330/261; 330/285
(58) Field of Classification Search ............. 330/130, 330/133, 134, 296, 297, 310, 267, 273, 261, 330/285
See application file for complete search history.

(56) References Cited

U.S. PATENT DOCUMENTS

| | | | |
|---|---|---|---|
| 5,182,527 A | 1/1993 | Nakanishi et al. | 330/285 |
| 5,608,353 A | 3/1997 | Pratt | 330/295 |
| 5,629,648 A | 5/1997 | Pratt | 330/289 |
| 5,808,453 A | 9/1998 | Lee et al. | 323/224 |
| 5,870,296 A | 2/1999 | Schaffer | 363/65 |
| 6,137,274 A | 10/2000 | Rajagopalan | 323/272 |
| 6,313,705 B1 | 11/2001 | Dening et al. | 330/276 |
| 6,414,469 B1 | 7/2002 | Zhou et al. | 323/272 |
| RE38,140 E | 6/2003 | Schaffer | 363/65 |
| 6,701,138 B2 | 3/2004 | Epperson et al. | 455/127 |
| 6,734,724 B1 | 5/2004 | Schell et al. | 330/10 |
| 2003/0054778 A1 | 3/2003 | Hecht | 455/115 |
| 2004/0183511 A1 | 9/2004 | Dening | 323/282 |
| 2004/0263254 A1* | 12/2004 | Tahara et al. | 330/285 |

OTHER PUBLICATIONS

P. Asbeck, G. Hanington, P. F. Chen, and L.Larson, "Efficiency and Linearity Improvement in Power Amplifiers for Wireless Communications," University of California, San Diego, La Jolla, CA, IEEE 1998, pp. 15-18.

* cited by examiner

*Primary Examiner*—Michael B Shingleton
(74) *Attorney, Agent, or Firm*—Withrow & Terranova, PLLC

(57) ABSTRACT

A power amplifier configuration including power amplifier circuitry and power control circuitry and having improved Power Added Efficiency (PAE) is provided. The power amplifier circuitry includes one or more input amplifier stages in series with a final amplifier stage. The power control circuitry provides a variable supply voltage to the input amplifier stages based on an adjustable power control signal. The final amplifier stage is powered by a fixed supply voltage. In operation, as output power of the power amplifier is reduced from its highest power level, the variable supply voltage is reduced. Accordingly, RF power of an amplified signal provided to the final amplifier stage from the input amplifier stages decreases, and the final amplifier stage transitions from saturation to linear operation, thereby increasing the gain of the final amplifier stage. Thus, a desired output level can be maintained while operating at lower current levels.

33 Claims, 6 Drawing Sheets

POWER AMPLIFIER CONTROL TECHNIQUE FOR ENHANCED EFFICIENCY

FIELD OF THE INVENTION

The present invention relates to radio frequency (RF) power amplifiers and more particularly relates to an RF power amplifier having enhanced efficiency.

BACKGROUND OF THE INVENTION

In recent years, worldwide demand for wireless cellular communications has increased dramatically. Mobile terminals manufactured to meet this burgeoning demand must adhere to standards such as the Global System for Mobile Communications (GSM) standard. Another standard, the Digital Cellular System (DCS) standard is based on GSM, but is directed towards higher cell density and lower power. A third standard, Personal Communications Services (PCS), is a "catch all" for many digital cellular systems, including GSM, operating in North America. These standards all require precise output power control over a large dynamic range in order to prevent a transmitter located in one cell from interfering with the reception of transmissions from other transmitters in neighboring cells.

Accordingly, a key component common to all mobile terminals is a radio frequency (RF) power amplifier. In operation, power amplifiers receive as input a frequency or phase modulated radio frequency carrier and amplify the RF carrier to a level sufficient for reception by a cellular base station. However, due to its inherent nature, the power amplifier requires a significant amount of power and is a primary factor in determining the battery-life of the mobile terminal. The power consumption of the power amplifier and thus the mobile terminal is dependent upon a Power Added Efficiency (PAE) of the power amplifier. Since one of the primary goals in designing mobile terminals is to reduce power consumption in order to increase battery-life, there remains a need for a power amplifier having increased PAE, which leads to increased battery-life for the mobile terminal.

SUMMARY OF THE INVENTION

The present invention provides a power amplifier configuration producing improved Power Added Efficiency (PAE). In general, the power amplifier configuration includes power amplifier circuitry and power control circuitry. The power amplifier circuitry includes one or more input amplifier stages in series with a final amplifier stage. The power control circuitry provides a variable supply voltage to the one or more input amplifier stages based on an adjustable power control signal. In one embodiment, the final amplifier stage is powered by a fixed supply voltage.

In this embodiment, the final amplifier stage operates in either saturation mode or linear mode based on a radio frequency (RF) power of an amplified signal provided to the final amplifier stage from the one or more input amplifier stage. More specifically, as output power of the power amplifier is reduced from its highest power level, the variable supply voltage provided to the one or more input amplifier stages is reduced. As a result, the RF power of the amplified signal provided to the final amplifier stage decreases, and the final amplifier stage transitions from saturation to linear mode, which increases a gain of the final amplifier stage. By increasing the gain of the final amplifier stage, the power amplifier circuitry provides essentially the same output power level as a power amplifier where the final amplifier stage operates in saturation for all output power levels while operating at lower current levels. Accordingly, the power consumption of the power amplifier circuitry is reduced, thereby improving the PAE of the power amplifier circuitry.

According to a first embodiment, a constant bias is supplied to the one or more input amplifier stages and a variable bias is supplied to the final amplifier stage. The variable bias is supplied based on the variable supply voltage and the constant bias such that a quiescent current of the final amplifier stage and thus the power amplifier circuitry is reduced at low output power levels. More particularly, the bias supplied to the final amplifier stage is variable at low output power levels and is constant at all other power levels. According to a second embodiment, a constant bias is provided to the one or more input amplifier stages and the final amplifier stage.

In another embodiment of the present invention, the power control circuitry provides a first variable supply voltage to the one or more input amplifier stages based on the adjustable power control signal and a second variable supply voltage to the final amplifier stage such that the final amplifier stage remains in saturation. In general, the adjustable power control signal is indicative of an RF power at the input of the final amplifier stage. Thus, as the adjustable power control signal and thus the RF power at the input of the final amplifier stage is reduced from a maximum value to a predetermined threshold value, the second variable supply voltage is provided such that it is essentially a fixed voltage. Once the RF power at the input of the final amplifier stage is reduced below the predetermined threshold value, the second supply voltage is reduced such that the final amplifier stage remains in saturation.

More particularly, the second variable supply voltage is a fixed voltage when the adjustable power control signal is above a predetermined threshold level. As the adjustable power control signal decreases and the RF power at the input of the final amplifier stage reduces from a maximum value to the predetermined threshold value, the final amplifier stage transitions from a first operating point in saturation to a second operating point in saturation that is nearer to linear mode. In one embodiment, the second operating point is an operating point immediately before the transition from saturation to linear mode. The predetermined threshold value is selected to correspond to the second operating point in saturation. As the adjustable power control signal is reduced such that the RF power at the input of the final amplifier stage decreases below the predetermined threshold value, the power control circuitry operates to reduce the second variable supply voltage, thereby forcing the final stage amplifier to remain in saturation.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
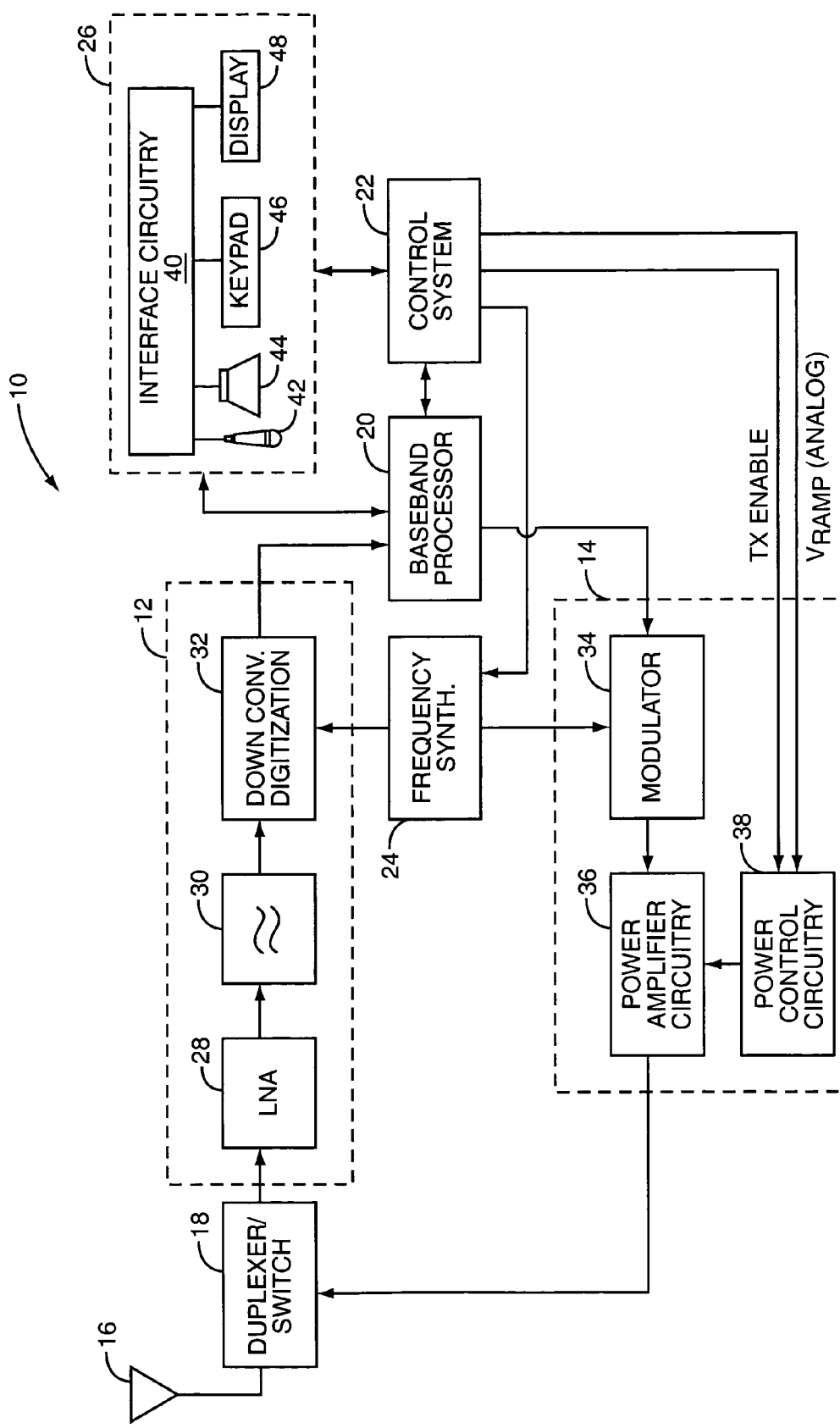
FIG. 1 illustrates a mobile terminal according to one embodiment of the present invention.

The present invention is preferably incorporated in a mobile terminal 10, such a mobile telephone, personal digital assistant, or the like. The basic architecture of a mobile terminal 10 is represented in FIG. 1 and may include a receiver front end 12, a radio frequency transmitter section 14, an antenna 16, a duplexer or switch 18, a baseband processor 20, a control system 22, a frequency synthesizer 24, and an interface 26. The receiver front end 12 receives information bearing radio frequency signals from one or more remote transmitters provided by a base station. A low noise amplifier 28 amplifies the signal. A filter circuit 30 minimizes broadband interference in the received signal, while a downconverter 32 downconverts the filtered, received signal to an intermediate or baseband frequency signal, which is then digitized into one or more digital streams. The receiver front end 12 typically uses one or more mixing frequencies generated by the frequency synthesizer 24.

The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The encoded data is output to the transmitter 14, where it is used by a modulator 34 to modulate a carrier signal that is at a desired transmit frequency. Power amplifier circuitry 36 amplifies the modulated carrier signal to a level appropriate for transmission from the antenna 16.

As described in further detail below, the power amplifier circuitry 36 provides gain for the signal to be transmitted under control of power control circuitry 38, which is preferably controlled by the control system 22 using an adjustable gain control signal ($V_{RAMP}$). As illustrated, the adjustable gain control signal ($V_{RAMP}$) is an analog signal. However, the adjustable gain control signal ($V_{RAMP}$) may alternatively be a digital signal. The control system 22 may also provide a transmit enable signal (TX ENABLE) to effectively turn the power amplifier circuitry 36 and power control circuitry 38 on during periods of transmission.

A user may interact with the mobile terminal 10 via the interface 26, which may include interface circuitry 40 associated with a microphone 42, a speaker 44, a keypad 46, and a display 48. The interface circuitry 40 typically includes analog-to-digital converters, digital-to-analog converters, amplifiers, and the like. Additionally, it may include a voice encoder/decoder, in which case it may communicate directly with the baseband processor 20.

The microphone 42 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving the speaker 44 by the I/O and interface circuitry 40. The keypad 46 and display 48 enable the user to interact with the mobile terminal 10, input numbers to be dialed, address book information, or the like, as well as monitor call progress information.

Figure 2:
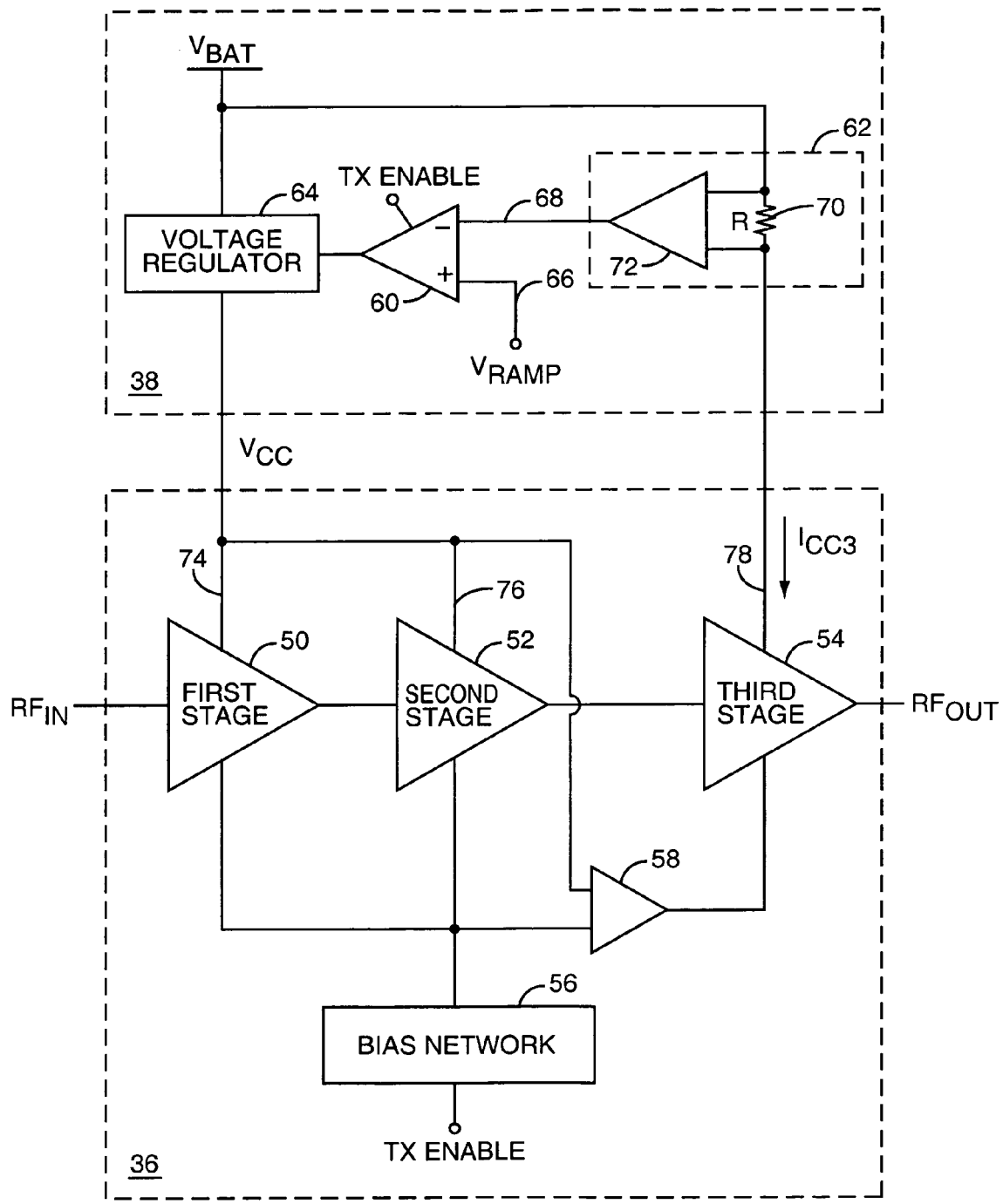
FIG. 2 illustrates a first embodiment of the power amplifier circuitry and power control circuitry of the present invention.

Turning now to FIG. 2, the power amplifier circuitry 36 is associated with the power control circuitry 38. In this embodiment, the power amplifier circuitry 36 includes three amplifier stages, a first amplifier stage 50, a second amplifier stage 52, and a third amplifier stage 54, as well as a bias network 56 and device 58. As discussed below in more detail, the first and second amplifier stages 50 and 52 are powered by a variable supply voltage ($V_{CC}$), and the third amplifier stage 54 is powered by a fixed voltage ($V_{BAT}$). As illustrated, there are two input amplifier stages 50 and 52. However, it should be noted that there may be any number of input amplifier stages. The bias network 56 provides an essentially constant bias to each of the first and second amplifier stages 50 and 52. However, device 58 provides a variable bias to the third amplifier stage 54. The device 58 operates to reduce the variable bias to the third amplifier stage 54 at low output power levels such that a quiescent current, also known as an idle current, for the third amplifier stage 54 is reduced.

More specifically, a radio frequency signal to be amplified ($RF_{IN}$) is provided to the first stage amplifier 50 and amplified by the three amplifier stages 50, 52, and 54 to provide an amplified output signal ($RF_{OUT}$) at the output of the third amplifier stage 54. The control system 22 (FIG. 1) provides the adjustable power control signal ($V_{RAMP}$) to the power control circuitry 38 to control an output power of the power amplifier circuitry 36 during a transmit burst. Based on the adjustable control signal ($V_{RAMP}$) and a signal indicative of the output power of the power amplifier circuitry 36, the power control circuitry 38 controls the variable supply voltage ($V_{CC}$) and thus the gain of the first and second amplifier stages 50 and 52. Accordingly, the output power of the power amplifier circuitry 36 is determined by the magnitude of the adjustable power control signal ($V_{RAMP}$). The bias network 56 provides the constant bias such that the first and second stage amplifiers 50 and 52 are in saturation, also know as compression, at all output power levels. By controlling the first and second amplifier stages 50 and 52 such that they operate in saturation, gain and noise from these stages are limited. Further, by limiting the gain of the first and second amplifier stages 50 and 52, the RF stability of the power amplifier circuitry 38 is enhanced.

The third amplifier stage 54 operates in either saturation mode or linear mode based on an RF power at the input of the third amplifier stage 54. In one embodiment, the third amplifier stage 54 is in saturation at the highest output power level. As the power level is reduced from the highest output power level to a lower output power level, the voltage ($V_{CC}$) and thus an RF power of the RF signal at the output of the second amplifier stage 52 is reduced, thereby reducing the RF power at the input of the third amplifier stage 54. Accordingly, the third amplifier stage 54 moves from saturation into linear mode. In doing so, a gain of the third amplifier stage 54 is increased. Thus, as compared to a situation where the third amplifier stage 54 operates in saturation for all output power levels, the power amplifier circuitry 36 provides the lower output power level while operating at lower current levels by allowing the third amplifier stage 54 to transition from saturation to linear mode. Accordingly, the power added efficiency (PAE) of the power amplifier circuitry 36 is increased, which results in increasing the battery-life of the mobile terminal 10. Further, as discussed above, at low output power levels, the device 58 operates to reduce the variable bias supplied to the third amplifier stage 54, thereby further improving the PAE of the power amplifier circuitry 36 and thus the battery-life of the mobile terminal 10.

The bias network 56 supplies the constant bias to the first and second amplifier stages 50 and 52 regardless of the variable supply voltage ($V_{CC}$) supplied to the first and second amplifier stages 50 and 52. However, in this embodiment, the device 58 operates to provide the variable bias to the third amplifier stage 54 based on the voltage ($V_{CC}$) and the constant bias supplied to the first and second amplifier stages 50 and 52. In general, the device 58 operates such that the variable bias supplied to the third amplifier stage 54 is reduced for low output power levels of the power amplifier circuitry 36 such that a quiescent current, also known as an idle current, of the third amplifier stage 54 and thus the power amplifier circuitry 36 is reduced at low output power levels. By reducing the quiescent current at low output power levels, the efficiency of the power amplifier circuitry 36 is improved and the battery-life of the mobile terminal 10 is increased.

Preferably, the device 58 operates such that the variable bias current supplied to the third stage amplifier 54 increases as the voltage ($V_{CC}$) increases from zero to some predetermined voltage. For values of the voltage ($V_{CC}$) greater than or equal to the predetermined voltage, the variable bias supplied to the third amplifier stage 54 is preferably constant and, in one embodiment, is essentially equal to the constant bias supplied to the first and second amplifier stages 50 and 52. In one embodiment, the predetermined threshold is approximately 0.5V. Accordingly, the variable bias current increases from a predetermined level, such as zero, to the value of the constant bias as the voltage ($V_{CC}$) increases from zero to 0.5V. For all values of the voltage ($V_{CC}$) equal to or greater than 0.5V, the variable bias is constant and equal to the constant bias supplied to the first and second amplifier stages 50 and 52.

The power control circuitry 38 includes an error amplifier 60, current detection circuitry 62, and a voltage regulator 64. The adjustable power control signal ($V_{RAMP}$) is received by a positive input 66 of an operational amplifier forming the error amplifier 60. The current detection circuitry 62 operates to provide a signal indicative of a current ($I_{CC3}$) in the third amplifier stage 54 to a negative input 68 of the error amplifier 60. It should be noted that the signal indicative of the current ($I_{CC3}$) is also indicative of the output power of the power amplifier circuitry 36. Thus, the power control circuitry 38 operates based on the adjustable power control signal and the output power of the power amplifier circuitry 36. In this exemplary embodiment, the current detection circuitry 62 includes a resistor 70 and a differential amplifier 72. In general, the differential amplifier 72 amplifies a voltage across the resistor 70, thereby generating the signal that is indicative of the current ($I_{CC3}$).

The error amplifier 60 operates to provide a control signal to the voltage regulator 64 based on a comparison of the adjustable power control signal ($V_{RAMP}$) and the signal indicative of the current ($I_{CC3}$) from the current detection circuitry 62. Based on the control signal from the error amplifier 60, the voltage regulator 64 provides a regulated variable supply voltage ($V_{CC}$) to rails 74, 76 of the first and second amplifier stages 50, 52, respectively. These rails 74, 76 will typically be the collectors or drains of bipolar or field effect transistors forming the respective amplifier stages, as will be appreciated by those skilled in the art. The fixed voltage ($V_{BAT}$) from a battery (not shown) is provided to the rail 78 of third amplifier stage 54 via resistor 70. In this embodiment, the voltage ($V_{BAT}$) is also provided to the voltage regulator 64.

The transmitter control signal (TX ENABLE) is a logic signal used to simultaneously enable or disable the error amplifier 60 and the power amplifier circuitry 36. As illustrated, the transmitter control signal (TX ENABLE) controls the operation of the bias network 56 by removing the bias from each of the three amplifier stages 50, 52, and 54.

Figure 3:
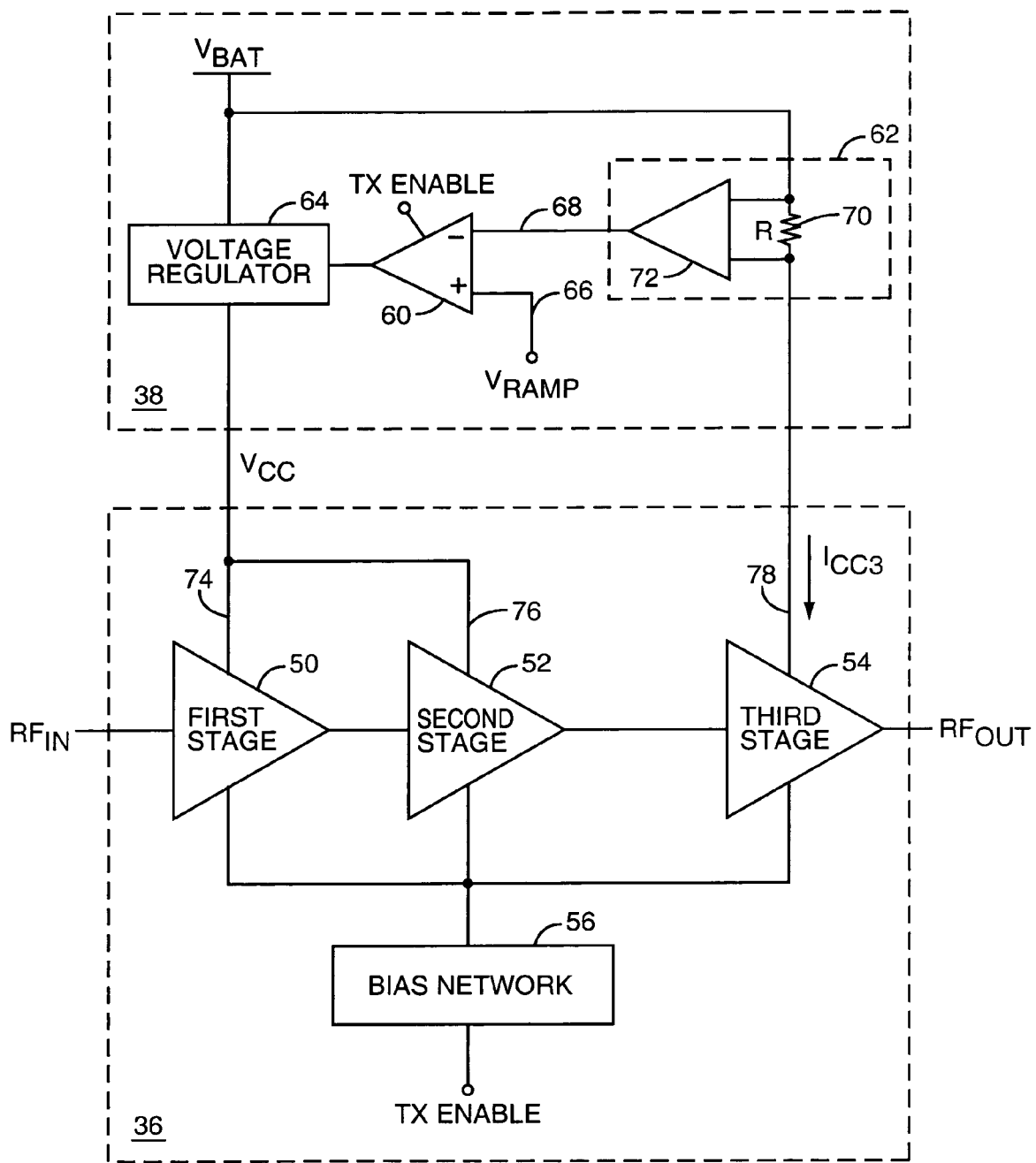
FIG. 3 illustrates a second embodiment of the power amplifier circuitry and power control circuitry of the present invention.

FIG. 3 illustrates another embodiment of the power amplifier circuitry 36. In this embodiment, the power amplifier circuitry 36 and the power control circuitry 38 operate essentially the same as described above. However, in this embodiment, the bias network 56 provides the constant bias to each of the three amplifier stages 50, 52, and 54. Thus, the third amplifier stage 54 receives the constant bias at all output power levels rather than receiving the variable bias as described above.

Figure 4:
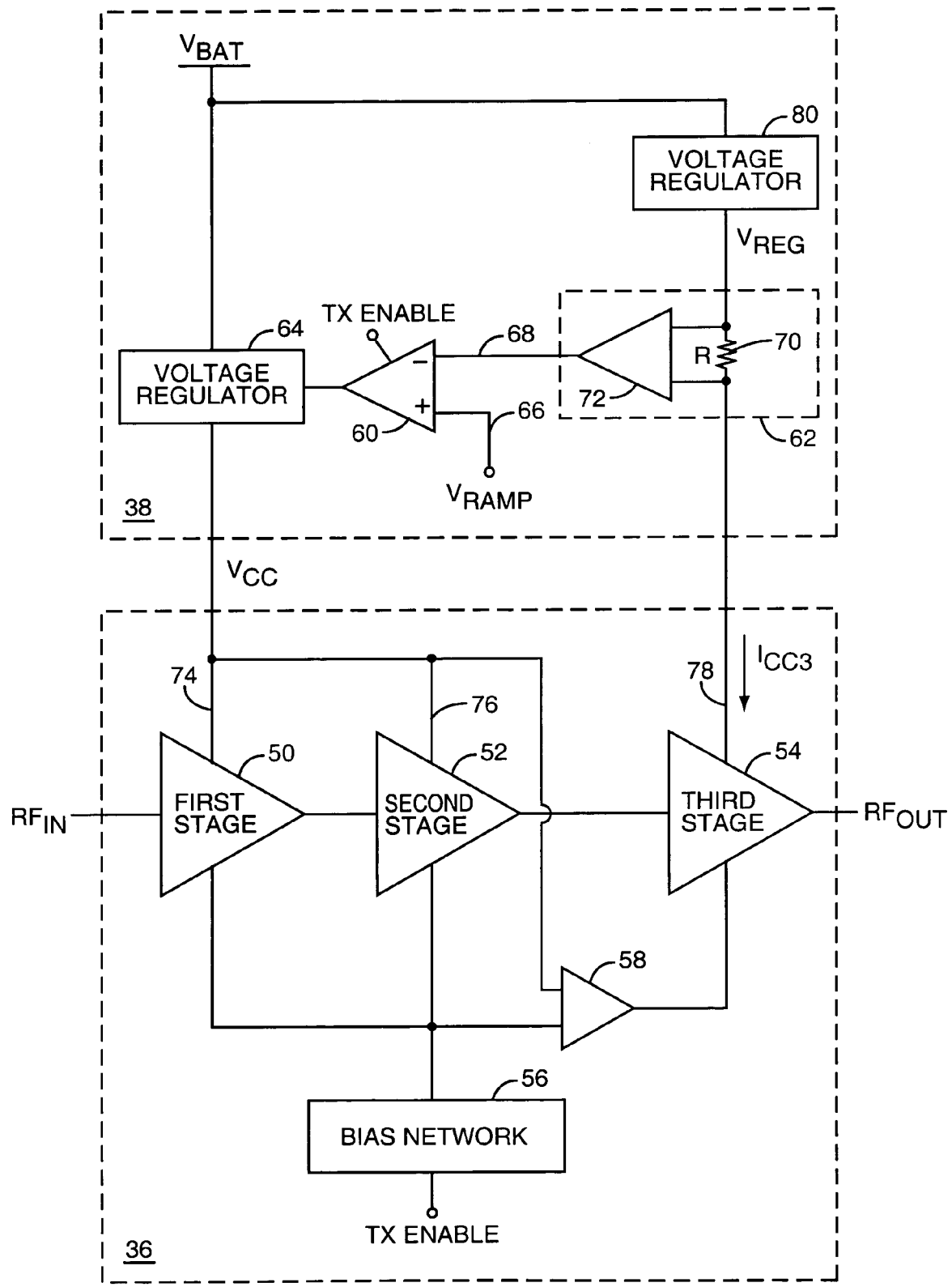
FIG. 4 illustrates a third embodiment of the power amplifier circuitry and power control circuitry of the present invention.

FIG. 4 illustrates another embodiment of the power control circuitry 38. In this embodiment, the power amplifier circuitry 36 and the power control circuitry 38 operate essentially the same as described above with reference to FIG. 2. However, in this embodiment, the power control circuitry 38 also includes a second voltage regulator 80 that provides a fixed voltage ($V_{REG}$) to the third amplifier stage 54 via the resistor 70. For example, the fixed voltage ($V_{REG}$) may be 3.4V. By providing the fixed voltage (VREG) to the third amplifier stage 54 rather than the battery voltage ($V_{BAT}$), thermal oscillation is reduced for higher battery voltages ($V_{BAT}$). Although the embodiment of the power amplifier circuitry 36 illustrated in FIG. 4 is the same as that illustrated in FIG. 2, it should be noted that the embodiment of the power control circuitry 38 illustrated in FIG. 4 may also be used with the embodiment of the power amplifier circuitry 36 illustrated in FIG. 3.

Figure 5:
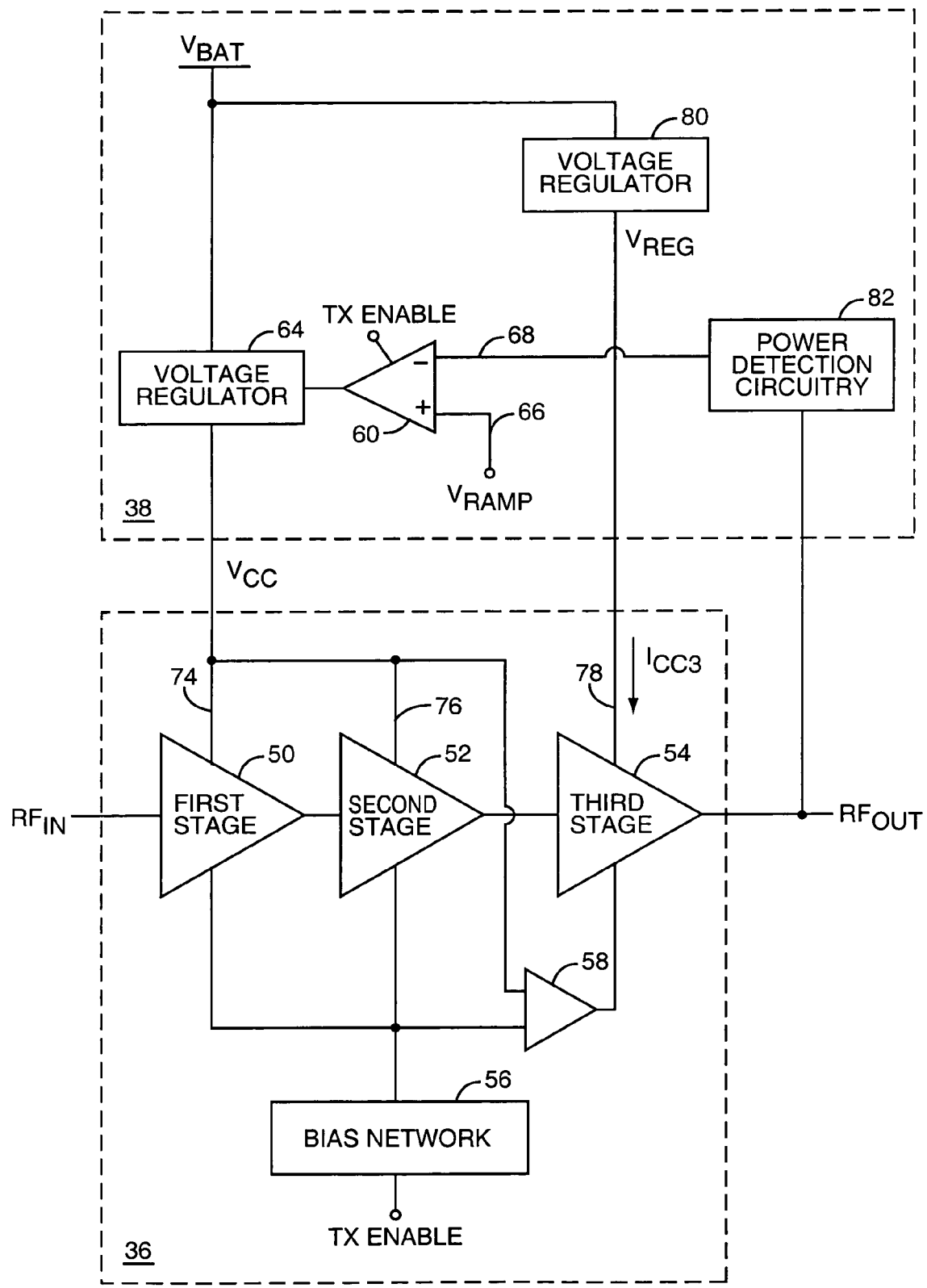
FIG. 5 illustrates a fourth embodiment of the power amplifier circuitry and power control circuitry of the present invention.

FIG. 5 illustrates another embodiment of the power control circuitry 38. In this embodiment, the power amplifier circuitry 36 and the power control circuitry 38 operate essentially the same as described above with reference to FIG. 4. However, in this embodiment, the current detection circuitry 62 is replaced by power detection circuitry 82, which is coupled to the output of the third amplifier stage 54. Numerous embodiments of the power detection circuitry 82 will be apparent to one of ordinary skill in the art upon reading this disclosure. For example, the power detection circuitry 82 may include a coupler and diode detector (not shown). In operation, the power detection circuitry 82 detects the output power of the third amplifier stage 54 and provides a signal indicative of the output power to the input 68 of the error amplifier 60. Similarly to the embodiments described above, the error amplifier 60 provides the control signal to the voltage regulator 64 based on a comparison of the signal indicative of the output power and the adjustable power control signal ($V_{RAMP}$).

Although the embodiment of the power control circuitry 38 illustrated in FIG. 5 includes the voltage regulator 80, it should be noted that in another embodiment, the fixed voltage may be supplied to the third amplifier stage 54 from the source voltage ($V_{BAT}$) rather than from the voltage regulator 80. Further, the power control circuitry 38 may include the current detection circuitry 62 rather than the power detection circuitry 82. It should also be noted that although the power amplifier 36 is illustrated as having the fixed bias supplied to the first and second amplifier stages 50 and 52 and the variable bias supplied to the third amplifier stage 54, in another embodiment, the fixed bias is supplied to all three of the amplifier stages 50, 52, and 54.

Figure 6:
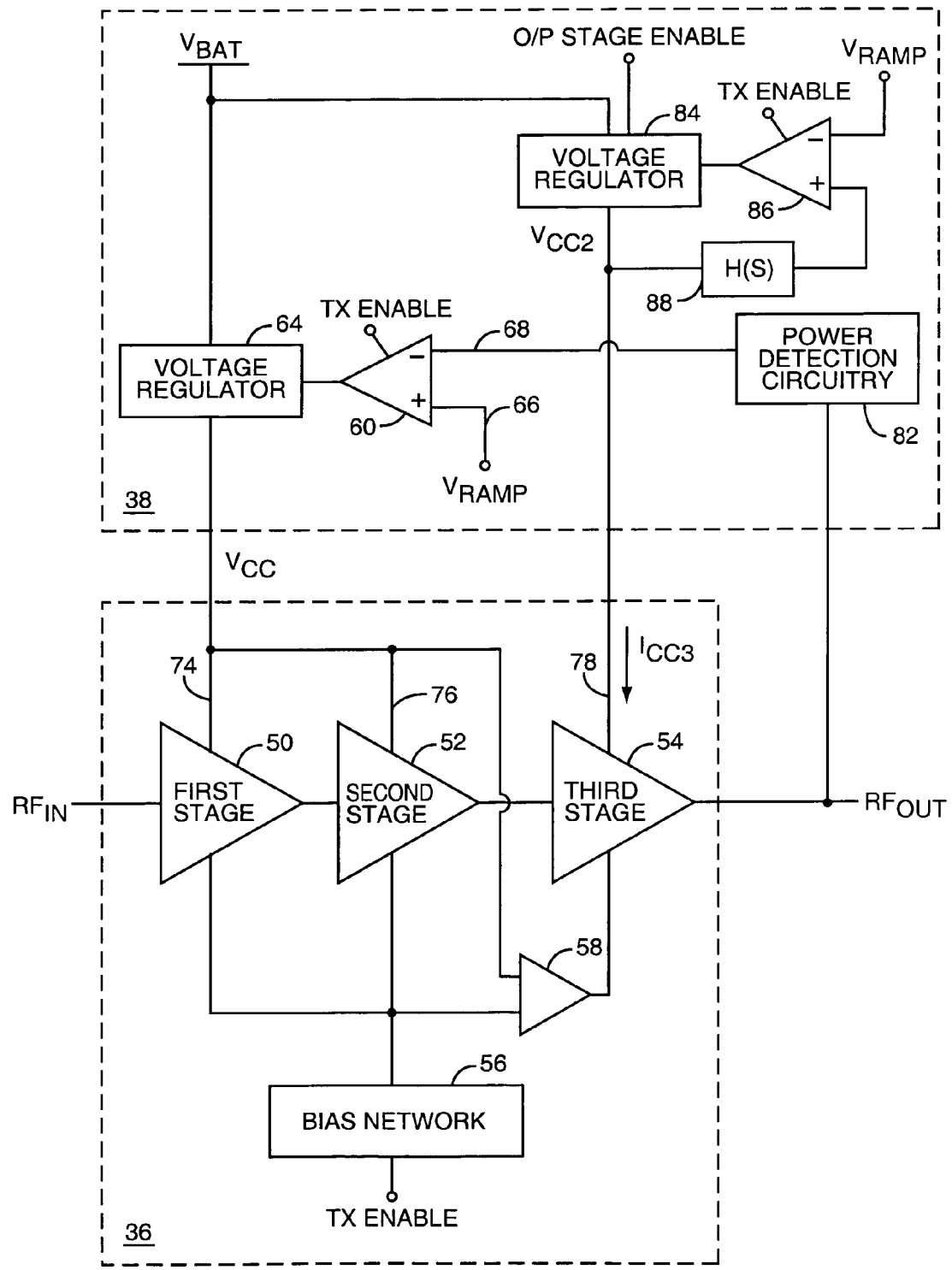
FIG. 6 illustrates a fifth embodiment of the power amplifier circuitry and power control circuitry of the present invention.

FIG. 6 illustrates another embodiment of the power control circuitry 38. In this embodiment, the operation of the power amplifier circuitry 36 and the power control circuitry 38 is similar to that described above. However, in this embodiment, the power control circuitry 38 provides a second variable supply voltage to the third amplifier stage 54 rather than a fixed voltage. In general, the power control circuitry 38 provides the second variable supply voltage such that the third amplifier stage 54 remains in saturation for all output power levels. More specifically, the power control circuitry 38 provides the second variable supply voltage such that it is a fixed voltage when the RF power at the input of the third amplifier stage 54 is above a predetermined threshold. In one embodiment, the power control circuitry 38 provides the second variable supply voltage such that it is the fixed voltage for at least the two highest power levels of the power amplifier 36. As the power level is reduced such that the RF power at the input of the third amplifier stage 54 falls below the predetermined threshold, the power control circuitry 38 reduces the second variable supply voltage such that the final amplifier stage 54 remains in saturation. The predetermined threshold is selected such that the power control circuitry 38 begins to reduce the second variable supply voltage from the fixed voltage before the final amplifier stage 54 transitions from saturation to linear mode, thereby forcing the third amplifier stage 54 to remain in saturation.

In this embodiment, the power control circuitry 38 includes a voltage regulator 84 and comparison circuitry 86 in addition to the error amplifier 60, the voltage regulator 64, and the power detection circuitry 82 described above. The voltage regulator 84 provides a second variable supply voltage ($V_{CC2}$) based on a control signal from the comparison circuitry 86. The comparison circuitry 86 provides the control signal based on the adjustable power control signal ($V_{RAMP}$) and a feedback signal from feedback circuitry 88. The adjustable power control signal ($V_{RAMP}$) is indicative of the RF power at the input of the third amplifier stage 54. Accordingly, as used herein, the predetermined threshold value refers to either the threshold value of the RF input power at the final amplifier stage 54 or a corresponding threshold value of the adjustable power control signal ($V_{RAMP}$). The feedback signal is indicative of the second variable supply voltage ($V_{CC2}$) at the output of the voltage regulator 84. The comparison circuitry 86 provides the control signal such that the second variable supply voltage ($V_{CC2}$) is essentially a fixed voltage when the adjustable power control signal ($V_{RAMP}$) is above the predetermined threshold value. As the adjustable power control signal ($V_{RAMP}$) is reduced below the predetermined threshold value, the comparison circuitry 86 provides the control signal such that the second variable supply voltage ($V_{CC2}$) is reduced below the fixed voltage and the third amplifier stage 54 remains in saturation.

The fixed voltage is selected to be a voltage that forces the final amplifier stage 54 into saturation. As the adjustable power control signal ($V_{RAMP}$) is reduced from a maximum value to the predetermined threshold value, the second variable supply voltage ($V_{CC2}$) remains essentially constant and equal to the fixed voltage. However, since the RF power at the input of the final amplifier stage 54 is reduced in response to reducing the adjustable power control signal ($V_{RAMP}$), the final amplifier stage 54 starts to transition from saturation to linear mode. The predetermined threshold value is selected such that prior to actually transitioning into the linear mode, the adjustable power control signal ($V_{RAMP}$) falls below the predetermined threshold value. In response, the power control circuitry 38 reduces the second variable supply voltage ($V_{CC2}$) such that the final amplifier stage 54 remains in saturation. As the adjustable power control signal ($V_{RAMP}$) is reduced below the predetermined threshold value, the RF drive power at the input of the final amplifier stage 54 decreases and the power control circuitry 38 operates to reduce the second variable supply voltage ($V_{CC2}$) such that the final amplifier stage 54 remains in saturation. In one embodiment, the power control circuitry 38 reduces the second variable supply voltage ($V_{CC2}$) linearly with respect to the adjustable power control signal ($V_{RAMP}$). Further, the rate at which the second variable supply voltage ($V_{CC2}$) is reduced may be controlled such that the second variable supply voltage ($V_{CC2}$) reaches a minimum value, such as zero, when the adjustable power control signal ($V_{RAMP}$) reaches its minimum value, which may also be zero.

As stated above, the predetermined threshold value of the adjustable power control signal ($V_{RAMP}$) is selected such that the final amplifier stage 54 does not actually transition from saturation to linear mode. More specifically, as the adjustable power control signal ($V_{RAMP}$) is reduced from its maximum value to the predetermined threshold value, the second variable supply voltage ($V_{CC2}$) remains at the fixed voltage. Accordingly, the final amplifier stage 54 transitions from the first operating point in saturation to a second operating point in saturation nearer to a point where the final amplifier stage 54 would transition from saturation to linear mode. The predetermined threshold value of the adjustable power control signal ($V_{RAMP}$) corresponds to the second operating point in saturation. It should be noted that the second operating point may vary depending on the exact design. It should also be noted that as the final amplifier stage 54 transitions from the first operation point in saturation to the second operating point in saturation that is near to linear mode, the gain of the final amplifier stage 54 increases, thereby increasing the PAE of the power amplifier 36 as described above.

Although the embodiment of the power control circuitry 38 illustrated in FIG. 6 includes the power detection circuitry 82, it should be noted that in another embodiment, the power control circuitry may include the current detection circuitry 62. It should also be noted that although the power amplifier 36 is illustrated as having the fixed bias supplied to the first and second amplifier stages 50 and 52 and the variable bias supplied to the third amplifier stage 54, in another embodiment, the fixed bias is supplied to all three of the amplifier stages 50, 52, and 54.

As also illustrated in FIG. 6, the voltage regulator 84 may operate based on an output stage enable signal (O/P STAGE ENABLE) to either provide the supply voltage ($V_{CC2}$) to the third amplifier stage 54 or provide an effective open-circuit to the third amplifier stage 54. The output stage enable signal may be provided by the control system 22 (FIG. 1). As described in detail in U.S. Pat. No. 6,701,134, INCREASED DYNAMIC RANGE FOR POWER AMPLIFIERS USED WITH POLAR MODULATION, issued Mar. 2, 2004, which is assigned to RF Micro Devices, Inc. of 7628 Thorndike Road, Greensboro, N.C. 27409 and is hereby incorporated by reference in its entirety, the dynamic range of the power amplifier circuitry 36 is increased by being able to either enable or disable the third amplifier stage 54. In general, for a lower output power range, the third amplifier stage 54 is disabled and operates to capacitively couple the output of the second amplifier stage 52 to the output of the power amplifier circuitry 36. For a higher output power range, the third amplifier stage 54 operates to amplify the output of the second amplifier stage 52 to provide the RF output signal.

Although enabling or disabling the third amplifier stage 54 is described with respect to FIG. 6, it should be noted that any of the embodiments of FIGS. 2–6 may include this feature. For example, in FIGS. 2 and 3, the output stage enable signal may be provided to additional circuitry such as a switch that either couples supply voltage to the third amplifier stage 54 or operates as an open circuit. In FIGS. 4 and 5, the output stage enable signal may be provided to the voltage regulator 80, which may provide the regulated voltage ($V_{REG}$) or operate as an open circuit based on the output stage enable signal.

The present invention provides substantial opportunity for variation without departing from the spirit and scope of the present invention. For example, the power amplifier circuitry 36 and the power control circuitry 38 may also be used in a polar modulation transmitter, wherein the power amplifier 36 amplifies a phase component of a polar transmit signal and the power control circuitry 38 controls the output power of the power control circuitry 36 based on an amplitude component of the polar transmit signal rather than or in addition to the adjustable power control signal ($V_{RAMP}$). As another example, although the bias network 56 is described as providing a constant bias to each of the first and second amplifier stages 50 and 52, the bias network 56 may alternatively provide a variable bias to each of the first and second amplifier stages 50 and 52. The bias network may provide the variable bias to the first and second amplifier stages 50 and 52 based on the supply voltage ($V_{CC}$) and may decrease the variable bias as the supply voltage ($V_{CC}$) decreases.

Those skilled in the art will recognize improvements and modifications to the preferred embodiments of the present invention. All such improvements and modifications are considered within the scope of the concepts disclosed herein and the claims that follow.

What is claimed is:

1. A system comprising:
   a) power amplifier circuitry comprising:
      i) at least one input amplifier stage adapted to operate in saturation and amplify a radio frequency input signal based on a variable supply voltage to provide an amplified radio frequency signal; and
      ii) a final amplifier stage adapted to receive a fixed supply voltage and adapted to amplify the amplified radio frequency signal to provide an output radio frequency signal; and
   b) power control circuitry adapted to provide the variable supply voltage based on an adjustable power control signal, thereby controlling an output power of the power amplifier circuitry based on the adjustable power control signal,
   wherein when the output power is reduced from a first output power level to a second output power level via the adjustable power control signal, the power control circuitry operates to reduce the variable supply voltage and thus the RF power of the amplified radio frequency signal such that the final amplifier stage transitions from a saturation mode to a linear mode thereby increasing a gain of the final amplifier stage.

2. The system of claim 1 wherein the final amplifier stage is further adapted to operate in either the saturation mode or the linear mode based on an RF power of the amplified radio frequency signal.

3. The system of claim 1 wherein the first output power level is a highest output power level of the power amplifier circuitry and the second output power level is a output power level less than the highest output power level.

4. The system of claim 1 wherein when the output power is increased back to the first output power level via the adjustable power control signal, the power control circuitry operates to increase the variable supply voltage and thus the RF power of the amplified radio frequency signal such that the final amplifier stage transitions from linear mode to saturation.

5. The system of claim 1 wherein the adjustable power control signal is provided to control an RF power of the amplified radio signal and thus the output power of the power amplifier circuitry by controlling the variable supply voltage provided by the power control circuitry.

6. The system of claim 1 wherein the power amplifier circuitry further comprises:
   bias circuitry adapted to provide a constant bias to the at least one input amplifier stage; and
   variable bias circuitry adapted to provide a variable bias to the final amplifier stage.

7. The system of claim 6 wherein the variable bias circuitry is further adapted to provide the variable bias based on the constant bias and the variable supply voltage.

8. The system of claim 6 wherein the variable bias circuitry is further adapted to provide the variable bias such that the variable bias is a constant value when the variable supply voltage is greater than a predetermined threshold voltage and the variable bias is less than the constant value when the variable supply voltage is less than the predetermined threshold voltage.

9. The system of claim 1 wherein the power amplifier circuitry further comprises bias circuitry adapted to provide a constant bias to the at least one input amplifier stage and the final amplifier stage.

10. The system of claim 1 wherein the power amplifier circuitry further comprises bias circuitry adapted to provide a variable bias to the at least one input amplifier stage and the final amplifier stage.

11. The system of claim 1 wherein the power control circuitry further comprises a voltage regulator adapted to provide the fixed supply voltage based on a source voltage.

12. A system comprising:
power amplifier circuitry comprising:
at least one input amplifier stage adapted to operate in saturation and amplify a radio frequency input signal based on a variable supply voltage to provide an amplified radio frequency signal; and
a final amplifier stage adapted to receive a fixed supply voltage and adapted to amplify the amplified radio frequency signal to provide an output radio frequency signal;
power control circuitry adapted to provide the variable supply voltage based on an adjustable power control signal, thereby controlling an output power of the power amplifier circuitry based on the adjustable power control signal;
current detection circuitry adapted to detect a current in the final amplifier stage and provide a signal indicative of the current;
error amplification circuitry adapted to provide a control signal based on a comparison of the adjustable power control signal and the signal indicative of the current in the final amplifier stage; and
a voltage regulator adapted to provide the variable supply voltage based on the control signal and a source voltage.

13. The system of claim 12 wherein the fixed supply voltage is the source voltage.

14. The system of claim 12 wherein the power control circuitry further comprises a second voltage regulator adapted to provide the fixed supply voltage based on the source voltage.

15. The system of claim 1 wherein the power control circuitry comprises:
power detection circuitry adapted to detect an output power at an output of the final amplifier stage and provide a signal indicative of the output power;
error amplification circuitry adapted to provide a control signal based on a comparison of the adjustable power control signal and the signal indicative of the output power; and
a voltage regulator adapted to provide the variable supply voltage based on the control signal and a source voltage.

16. The system of claim 15 wherein the fixed supply voltage is the source voltage.

17. The system of claim 15 wherein the power control circuitry further comprises a second voltage regulator adapted to provide the fixed supply voltage based on the source voltage.

18. The system of claim 1 wherein the at least one input amplifier stage comprises a first amplifier stage connected in series with a second amplifier stage, each of the first and second amplifier stages operating based on the variable supply voltage.

19. The system of claim 18 wherein the power amplifier circuitry further comprises:
bias circuitry adapted to provide a constant bias to the first and second amplifier stages; and
variable bias circuitry adapted to provide a variable bias to the final amplifier stage.

20. The system of claim 1 wherein the system is a mobile terminal and further comprises a control system adapted to provide the adjustable power control signal to control the RF power of the amplified radio signal and thus the output power of the power amplifier circuitry.

21. A method comprising:
a) providing at least one input amplifier stage in series with a final amplifier stage for amplifying a radio frequency input signal, the at least one input amplifier stage operating in saturation;
b) providing power to the at least one input amplifier stage from a variable supply voltage;
c) providing a fixed supply voltage to the final amplifier stage; and
d) providing the variable supply voltage responsive to an adjustable power control signal, thereby controlling an output power of the at least one input amplifier stage and the final amplifier stage,
wherein when the output power is reduced from a first output power level to a second output power level via the adjustable power control signal, the step of providing the variable supply voltage comprises reducing the variable supply voltage and thus an RF input power at the input of the final amplifier stage such that the final amplifier stage transitions from saturation mode to linear mode thereby increasing a gain of the final amplifier stage.

22. The method of claim 21 further comprising:
providing a constant bias to the at least one input amplifier stage; and
providing a variable bias to the final amplifier stage.

23. The method of claim 22 wherein the step of providing the variable bias further comprises providing the variable bias based on the constant bias and the variable supply voltage.

24. The method of claim 23 wherein the step of providing the variable bias further comprising providing the variable bias such that the variable bias is a constant value when the variable supply voltage is greater than a predetermined threshold voltage and the variable bias is less than the constant value when the variable supply voltage is less than the predetermined threshold voltage.

25. The method of claim 21 further comprising providing a constant bias to the at least one input amplifier stage and the final amplifier stage.

26. The method of claim 21 further comprising providing a variable bias to the at least one input amplifier stage and the final amplifier stage.

27. A method comprising:
providing at least one input amplifier stage in series with a final amplifier stage for amplifying a radio frequency input signal, the at least one input amplifier stage operating in saturation;
providing power to the at least one input amplifier stage from a variable supply voltage;
providing a fixed supply voltage to the final amplifier stage;
providing the variable supply voltage responsive to an adjustable power control signal, thereby controlling an output power of the at least one input amplifier stage and the final amplifier stage;
providing a signal indicative of a current in the final amplifier stage;
providing a control signal based on a comparison of the adjustable power control signal and the signal indicative of the current in the final amplifier stage; and
providing the variable supply voltage based on the control signal and a source voltage.

28. The method of claim 27 wherein the fixed supply voltage is the source voltage.

29. The method of claim 27 wherein the step of providing power to the final amplifier stage from the fixed supply voltage comprises providing a regulated voltage as the fixed supply voltage based on the source voltage.

30. The method of claim 21 wherein the step of providing the variable supply voltage comprises:
providing a signal indicative of an output power at an output of the final amplifier stage;
providing a control signal based on a comparison of the adjustable power control signal and the signal indicative of the output power; and
providing the variable supply voltage based on the control signal and a source voltage.

31. The method of claim 30 wherein the fixed supply voltage is the source voltage.

32. The method of claim 30 wherein the step of providing power to the final amplifier stage from the fixed supply voltage comprises providing a regulated voltage as the fixed supply voltage based on the source voltage.

33. The method of claim 31 wherein when the output power is increased back to the first output power level via the adjustable power control signal, the step of providing the variable supply voltage comprises increasing the variable supply voltage and thus the RF input power at the input of the final amplifier stage such that the final amplifier stage transitions from linear mode to saturation.

* * * * *